United States Patent
Neijzen et al.

(10) Patent No.: US 7,312,846 B2
(45) Date of Patent: *Dec. 25, 2007

(54) LITHOGRAPHIC APPARATUS AND DEVICE MANUFACTURING METHOD

(75) Inventors: Jacobus Hermanus Maria Neijzen, Heeze (NL); Rene Monshouwer, Leiden (NL)

(73) Assignee: ASML Netherlands B.V., Veldhoven (NL)

( * ) Notice: Subject to any disclaimer, the term of this patent is extended or adjusted under 35 U.S.C. 154(b) by 82 days.

This patent is subject to a terminal disclaimer.

(21) Appl. No.: 10/920,328

(22) Filed: Aug. 18, 2004

(65) Prior Publication Data

US 2005/0012915 A1 Jan. 20, 2005

Related U.S. Application Data

(63) Continuation of application No. 10/273,352, filed on Oct. 18, 2002, now Pat. No. 6,803,993.

(30) Foreign Application Priority Data

Oct. 19, 2001 (EP) .................................. 01308925

(51) Int. Cl.
  *G03B 27/42* (2006.01)
  *G03B 11/00* (2006.01)
(52) U.S. Cl. .................... 355/53; 356/400; 356/401
(58) Field of Classification Search .................. 355/53, 355/67, 77; 356/363, 400, 401; 250/548
See application file for complete search history.

(56) References Cited

U.S. PATENT DOCUMENTS

| 4,083,627 A | * | 4/1978 | Okano ........................ 359/574 |
| 4,631,416 A | * | 12/1986 | Trutna, Jr. .................. 250/548 |
| 4,710,026 A | | 12/1987 | Magome et al. |
| 5,160,849 A | | 11/1992 | Ota et al. |
| 5,229,872 A | | 7/1993 | Mumola |
| 5,296,891 A | | 3/1994 | Vogt et al. |
| 5,371,570 A | | 12/1994 | Morris et al. |
| 5,489,986 A | | 2/1996 | Magome et al. |
| 5,523,193 A | | 6/1996 | Nelson |
| 5,559,601 A | | 9/1996 | Gallatin et al. |
| 5,801,390 A | | 9/1998 | Shiraishi |
| 5,969,441 A | | 10/1999 | Loopstra et al. |
| 6,034,378 A | | 3/2000 | Shiraishi |
| 6,046,792 A | | 4/2000 | Van Der Werf et al. |

(Continued)

FOREIGN PATENT DOCUMENTS

EP 0 445871 A1 9/1991

(Continued)

OTHER PUBLICATIONS

Hecht, Optics, 2$^{nd}$ Edition, Addison-Wesley Publishing Co., 1987, p. 149.*

(Continued)

*Primary Examiner*—Rondey Fuller
(74) *Attorney, Agent, or Firm*—Pillsbury Winthrop Shaw Pittman LLP

(57) ABSTRACT

An off-axis alignment system in a lithographic projection apparatus uses broadband radiation to illuminate a phase grating on the wafer. The broadband radiation source may include fluorescent materials, e.g. Yag:Ce or ND:Yag crystals illuminated by excitation light.

22 Claims, 4 Drawing Sheets

U.S. PATENT DOCUMENTS

| | | | |
|---|---|---|---|
| 6,242,754 B1 * | 6/2001 | Shiraishi | 250/548 |
| 2003/0210482 A1 * | 11/2003 | Arnold | 359/853 |
| 2005/0051742 A1 * | 3/2005 | Shiraishi | 250/548 |

FOREIGN PATENT DOCUMENTS

| | | |
|---|---|---|
| JP | 7-74082 | 3/1995 |
| JP | 7-86126 | 3/1995 |
| JP | 7-183203 | 7/1995 |
| JP | 8-288197 | 11/1996 |
| JP | 9-186080 | 7/1997 |
| WO | WO 98/33096 | 7/1998 |
| WO | WO 98/38597 | 9/1998 |
| WO | WO 98/39689 | 9/1998 |
| WO | WO 98/40791 | 9/1998 |

OTHER PUBLICATIONS

Office Action dated Jul. 7, 2006 for Japanese Patent Application No. 2002-340135.

Japanese Office Action issued in JP Application No. 2002-340135 mailed Feb. 21, 2007.

* cited by examiner

LITHOGRAPHIC APPARATUS AND DEVICE MANUFACTURING METHOD

This is a continuation of U.S. application Ser. No. 10/273,352, filed Oct. 18, 2002, now U.S. Pat. No. 6,803,993, which claims priority to European Application No. 01308925.5, filed Oct. 19, 2001.

BACKGROUND OF THE INVENTION

1. Field of the Invention

The present invention relates to a lithographic projection apparatus.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a pattering device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a pattering device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. No. 5,969,441 and WO 98/40791.

The ever present demand in lithography to be able to image mask patterns with ever decreasing critical dimension (CD) necessitates increasing overlay accuracy (the accuracy with which two successive layers can be aligned with respect to each other). This drives a need for ever increasing alignment accuracy. Since the overlay error must be much smaller than the critical dimension and the alignment error is not the only contribution to overlay error, a critical dimension of 90 mn demands an alignment accuracy of 10 nm or less.

A known through-the-lens (TTL) alignment system uses linear phase gratings of 16 μm pitch etched onto the substrate which are illuminated by laser light. The diffracted light is then imaged on a reference grating. By scanning the substrate underneath the alignment system and detecting the light passing through the reference grating as a function of stage position, the position of the substrate can be estimated with nanometer accuracy. However, the known TTL alignment system uses one wavelength of laser light and is subject to process dependent errors. Such errors occur when previously produced process layers form diffractive structures affecting the wavelengths used in the alignment system. An alignment system using one wavelength of light is strongly affected by such errors, introducing a second frequency reduces these errors somewhat by averaging, since the different wavelengths will not be affected in the same way, but does not eliminate them entirely. Such errors can also be caused by asymmetrically deformed alignment marks.

U.S. Pat. No. 5,371,570 discloses a through the lens alignment system using broadband radiation to illuminate alignment marks on the wafer. However, the alignment radiation is produced by a halogen lamp. The beam produced by such a lamp has a high étendue (solid angle subtended by the beam multiplied by the area of the cross-section of the beam) therefore it is difficult to obtain a high measurement light intensity at the alignment mark, resulting in a low signal to noise ratio (SNR).

WO 98/39689 discloses an off-axis alignment system that uses multiple wavelengths and higher diffraction orders to avoid errors resulting from asymmetry of the alignment mark caused by chemical-mechanical polishing. The image of the grating is imaged for each color on a different reference grating to obtain a measurement signal.

U.S. Pat. No. 5,559,601 discloses an alignment system that uses laser diodes, e.g. providing four wavelengths, to illuminate mask and wafer marks. The wafer is scanned relative to the mask and alignment information derived by Fourier analysis of the intensity of the return radiation as a function of wafer position.

SUMMARY OF THE INVENTION

It is an aspect of the present invention to provide an improved alignment system, in particular one which is less susceptible to process-dependent effects.

This and other aspects are achieved according to the invention in a lithographic apparatus including a radiation system constructed and arranged to provide a projection beam of radiation; a support structure constructed and arranged to support a patterning device, the patterning device constructed and arranged to pattern the projection beam according to a desired pattern; a substrate table that holds a substrate; a projection system constructed and arranged to project the patterned beam onto a target portion of the substrate; and an off-axis alignment system including a radiation source constructed and arranged to illuminate a phase grating on a substrate held on the substrate table and an imaging system constructed and arranged to image diffracted light from the phase grating onto an image plane, wherein the imaging system images the phase grating onto one single image plane substantially correctly at at least two distinct wavelengths.

The use of an imaging system capable of imaging at least two wavelengths correctly onto a single image plane is advantageous in that it is more robust than single wavelength alignment. The use of multiple colors effectively averages out certain errors in the alignment signal due to asymmetric marks and the detection at one single imaging plane makes it unnecessary to mix the detection single of the two distinct wavelengths. Furthermore it diminishes the effect of thin film interference effects on signal strength. Both a true broadband spectrum and a set of discrete (laser) wavelengths may be used.

An advantage of periodic structures (gratings) over non-grating mark types is that effectively only a part of the total NA of the imaging system is used because the light is diffracted in very distinctively determined orders by the grating. By using non-grating mark types the mark image will be equally distributed over the total NA of the imaging system, and will be equally sensitive to aberrations in the total area of the pupil. The effective area of the pupil that is being used is also determined by the NA of the illumination system, however that is of relatively small influence.

The alignment system may comprise an illumination system for illuminating the phase grating with an NA greater than 0.01 preferably greater than 0.1 and most preferably greater than about 0.2. The use of an illumination NA larger than 0.01 is advantageously to get enough light on the grating, which is a problem for broadband sources having a high etendue. Laser sources commonly used for illuminating purposes have a low etendue and therefore there is no need for illuminating with a NA higher than 0.01 to get enough light upon the grating. Just the plane wave of the laser is radiated upon the grating.

Another advantage of illuminating with a relative high NA is that this makes the system less sensitive to illumination angle dependent errors. If the grating is illuminated from one direction, all the radiation from that one direction may suffer from the same illumination angle dependent error so that the total alignment signal is dependent on that error. In a higher NA illumination system the radiation is distributed over different illumination angles so that the illumination angle dependent errors are averaged out for the different angles.

A drawback of the relatively high illumination NA is that the grating must be in the focal plane of the illumination beam. The high illumination NA and the grating period make it further necessary that the imaging system for projecting diffracted light from the phase grating on the reference grating needs a relatively high NA. The imaging system may have a NA greater than about 0.7, preferably greater than 0.8, most preferably greater than about 0.9. The High NA of the imaging system makes also the imaging system focus sensitive. A separate focussing sensor is therefore needed in the alignment system.

Another drawback of the illumination system having a high NA is that the radiation of the illumination must have an homogeneous angular distribution. The use of a specially designed homogenizer may therefore be necessary.

The use of a small, e.g. less than 5 µm, preferably 1 µm, pitch grating enables a reduction of the interpolation needed in the data analysis/position estimation. This will proportionally decrease the influence of noise and mark asymmetry on the aligned position. Furthermore it enables the total area of the mark to be made as small as possible. Since the averaging of the alignment signal over the silicon area is actually related to the number of "edges" that are present in the alignment mark, the averaging and thus insensitivity for local perturbations is increased by decreasing the period of the phase grating.

According to a further aspect of the invention there is provided a device manufacturing method including providing a substrate that is at least partially covered by a layer of radiation-sensitive material; providing a projection beam of radiation using a radiation system; using a patterning device to endow the projection beam with a pattern in its cross-section; projecting the patterned beam of radiation onto a target portion of the layer of radiation-sensitive material; aligning the substrate to a reference grating by illuminating a phase grating provided on the substrate with radiation and imaging diffracted light from the phase grating onto the reference grating using an imaging system arranged to image the phase grating onto the reference grating substantially correctly at at least two distinct wavelengths.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
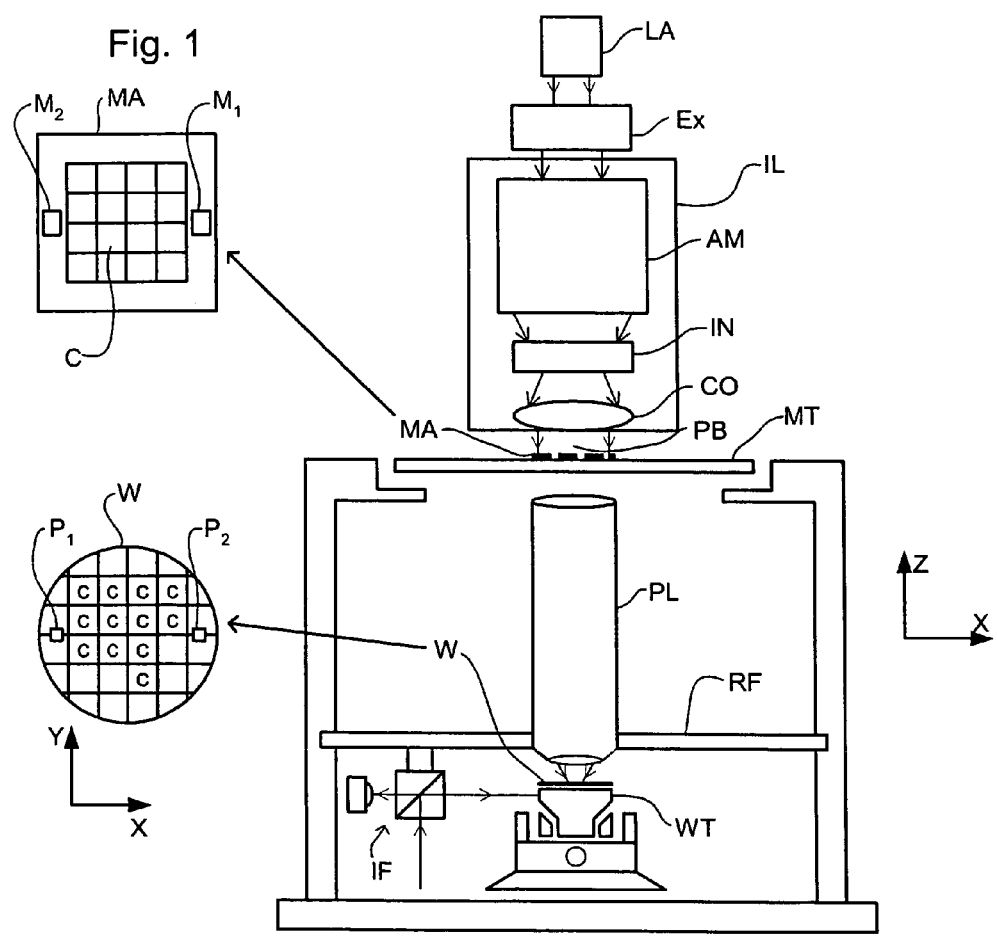
FIG. 1 depicts a lithographic projection apparatus according to an embodiment of the invention.

FIG. 1 schematically depicts a lithographic projection apparatus according to a particular embodiment of the invention. The apparatus includes a radiation system Ex, IL that supplies a projection beam PB of radiation (e.g. UV or EUV radiation). In this embodiment, the radiation system also comprises a radiation source LA; a first object table (mask table) MT provided with a mask holder for holding a mask MA (e.g. a reticle), and connected to a first positioning device $M_1$, $M_2$ to accurately position the mask with respect to a projection system PL; a second object table (substrate table) WT provided with a substrate holder for holding a substrate W (e.g. a resist-coated silicon wafer), and connected to a second positioning device $P_1$, $P_2$ to accurately position the substrate with respect to the projection system PL; the projection system ("lens") PL (e.g. a refractive or catadioptric system, a mirror group or an array of field deflectors) constructed and arranged to image an irradiated portion of the mask MA onto a target portion C (e.g. comprising one or more dies) of the substrate W. The projection system PL is supported on a reference frame RF. As here depicted, the apparatus is of a transmissive type (i.e. has a transmissive mask). However, in general, it may also be of a reflective type, for example (with a reflective mask). Alternatively, the apparatus may employ another kind of patterning device, such as a programmable mirror array of a type as referred to above.

The source LA (e.g. an excimer laser, an undulator or wiggler provided around the path of an electron beam in a storage ring or synchrotron, a laser-produced plasma source, a discharge source or an electron or ion beam source) produces a beam PB of radiation. The beam PB is fed into an illumination system (illuminator) IL, either directly or after having traversed a conditioner, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). The latter scenario is often the case when the source LA is an excimer laser. The current invention encompasses both of these scenarios.

The beam PB subsequently intercepts the mask MA, which is held on the mask table MT. Having traversed the mask MA, the beam PB passes through the lens PL, which focuses the beam PB onto a target portion C of the substrate W. With the aid of the second positioning device $P_1$, $P_2$ (and interferometer IF), the substrate table WT can be moved accurately, e.g. so as to position different target portions C in the path of the beam PB. Similarly, the first positioning device $M_1$, $M_2$ can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step-and-scan apparatus) the mask table MT may just be connected to a short stroke actuator, or may be fixed.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
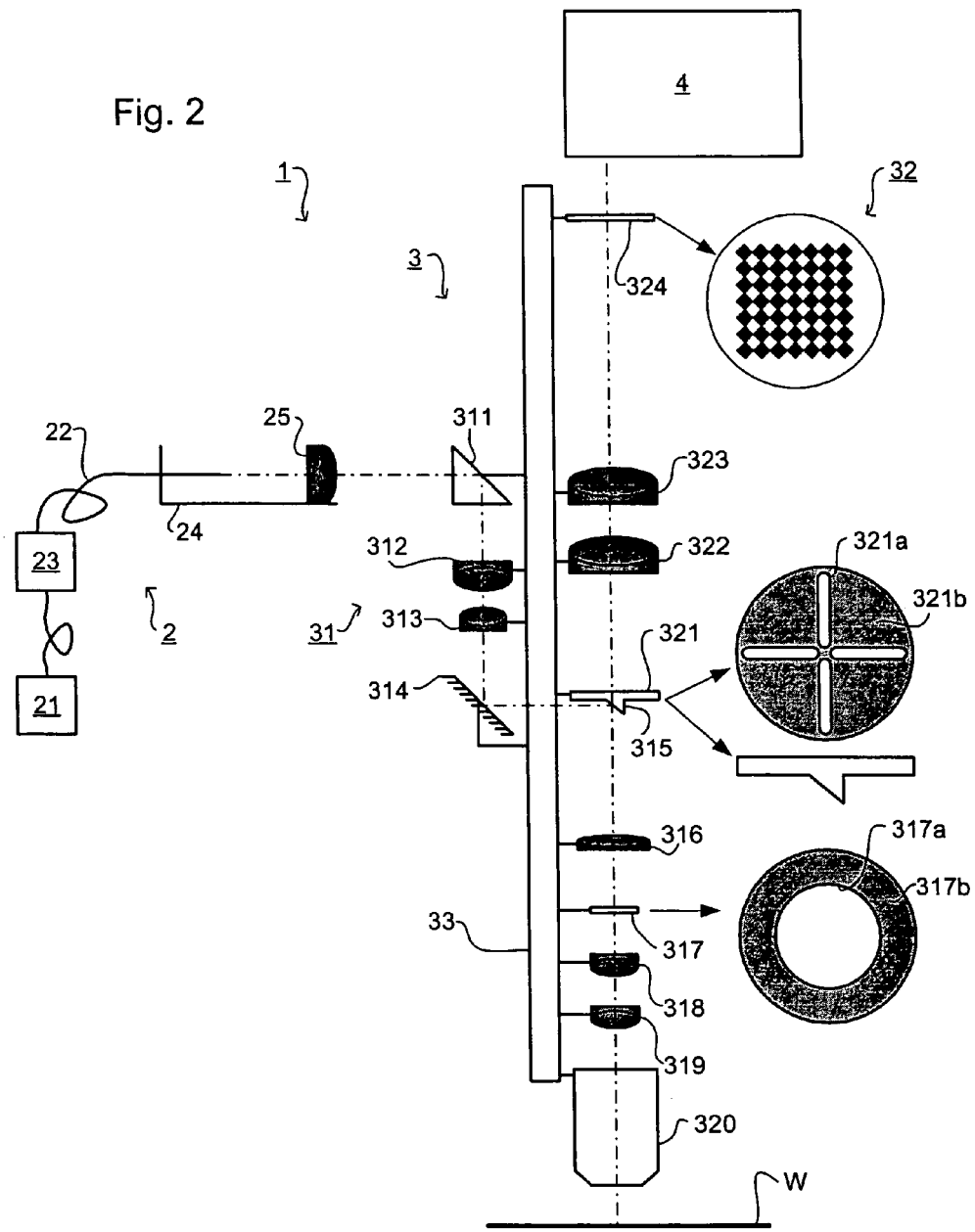
FIG. 2 is a diagram of the imaging section of an alignment system according to a first embodiment of the invention.

An off-axis alignment system forming part of the first embodiment of the present invention is shown generally in FIG. 2. The alignment system 1 comprises source module 2, optical module or imaging system 3 and detection module 4.

Source module 2 comprises a broadband source 21 with a low etendue, which is described further below, which outputs broadband radiation, e.g. in the visible region, into a multi-mode fiber 22. Interposed in the multi-mode fiber 22 is a homogenizer 23, also described further below. The output end of multi-mode fiber 22 is held in bracket 24 which also mounts lens 25. Lens 25 feeds the illumination light into the illumination branch 31 of the optical module 3. The illumination branch 31 comprises lenses 312, 313 which, together with lens 25 of the source module 2, focus the output facet of the fiber with a magnification of about 5 onto a small 45° mirror 315 which folds the beam into the imaging branch 32 of the optical module 3. Mirrors 311 and 314 are provided in the illumination branch 3 for convenient folding of the beam. Bracket 24 allows the end of fiber 22 and lens 25 to be positioned in three dimensions for accurate positioning of the source image.

Starting from the bottom, the imaging branch 32 comprises a high numerical aperture (NA), long working distance microscope objective 320. Next are two field lenses 319, 318 that re-image the wafer W onto the first intermediate image plane at which field stop 317 is provided. Lenses 318, 319 are arranged such that the first part of the imaging system is telecentric on both image and object side, with a magnification of exactly 30. At a pupil plane, spatial filter 321 is provided. The filter 321 has an opaque center 321b and apertures 321a extending parallel to the X and Y directions to select only the orders diffracted in the X and Y directions, i.e. not those diffracted by the diagonal structures in the mark and not the $0^{th}$-order. This part of the imaging system is telecentric on the object side (field stop 317) but not the image side, where a reference plate or mark or grating 324 is provided. This enables the overall length of the system to be reduced. The lenses 322, 323 are selected and positioned so that the total magnification of the imaging system from the wafer to the plane of the reference plate 324 is exactly 50. The magnification of the second part of the imaging branch is therefore 1⅔.

It will be appreciated that the magnification of the imaging system is related to the pitches of the substrate mark and reference grating. Because the $0^{th}$-order is blocked, the pitch of the substrate mask $P_{substrate}$, the magnification M and the pitch of the reference grating $P_{ref}$ must satisfy the following equation:

$$P_{ref} = \frac{1}{2} \cdot M \cdot P_{substrate}$$

The components of the optical module 3 are preferably rigidly mounted to a frame 33 made of an ultra low expansion material such as Invar or Zerodur and mounted on the reference frame of the apparatus.

The microscope objective 320 forms the first lens of the imaging branch of the optical module. This lens must have a numerical aperture large enough to capture sufficient diffraction orders from the alignment mark on the wafer and may, for example, have a numerical aperture NA of at least 0.8 or 0.9. It is additionally preferred to have a reasonable distance between the wafer and alignment system so that a long working distance objective is preferred. Commercially available microscope objectives are usable. The arrangement illustrated in FIG. 2 makes use of a microscope objective that does not have an accessible pupil plane. Accordingly, lenses 318, 319, 316 are provided to re-image the pupil plane at a physically accessible location where a pupil stop 321 can be provided. A more compact arrangement may be obtained if a microscope objective having a physically accessible pupil plane is used. Suitable objectives are known for use in phase contrast microscopes.

As will be appreciated, the basic principle of the alignment system is that an alignment mark provided on the wafer is imaged onto a corresponding reference mark provided in the system and alignment information is derived from measuring the intensity of radiation passing through the reference grating as the wafer is scanned. In the present invention, the reference mark comprises a two-dimensional grating having diamond-shaped unit cells, as shown in the enlargement in FIG. 2. The reference mark 324 is arranged to be symmetric around the optical axis of the imaging branch of the alignment system. This symmetry suppresses the influence of chromatic magnification errors on the aligned position. Since a change of magnification causes symmetric distortions, the errors on both sides of the optical axis cancel each other out, at least for small magnification errors. The use of a two-dimensional grating enables detection of alignment in both X and Y directions whilst preserving complete symmetry around the optical axis. Note though that the alignment marks on the wafer are still linear gratings and that only one direction is measured at a time.

The field stop 317 is positioned at the first intermediate image of the wafer and thereby serves as the field stop for both illumination and imaging. The imaging field can be further reduced by placing an additional field stop at the position of reference mark 324. To minimize the effects of clipping of the field, the field aperture 317a is circular. Acting as field stop of the imaging system, the field stop 317 determines the area of the mark that is detected. In the present invention, the detection field is smaller than the total mark size so that the detection field can remain within the mark during the scan of the alignment mark. This means there is no envelope in the intensity of the alignment signal, improving fitting in the detection system. Acting as field stop for the illumination branch, field stop 317 limits the field of illumination to be only slightly larger or identical to the detection field. This avoids the possibility that structures adjacent the alignment mark are also illuminated, which might lead to stray diffraction entering the imaging system and causing errors in the alignment signal.

Figure 3:
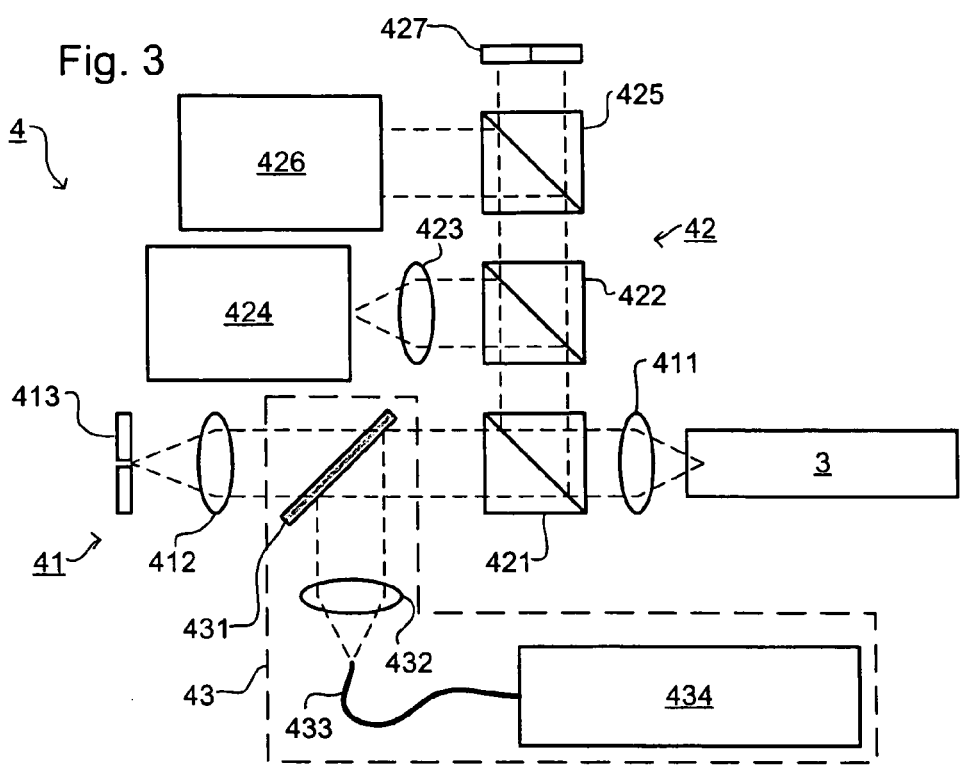
FIG. 3 is a diagram of the detection section of the alignment system according to the first embodiment of the invention.

Detection module 4 primarily measures the intensity of the light transmitted through the reference mark 324 that is located in an image plane of the system. The detection module also detects the focus signal and provides camera images of both the pupil plane and the wafer plane. The detection module 4 is shown in more detail in FIG. 3.

Figure 4:
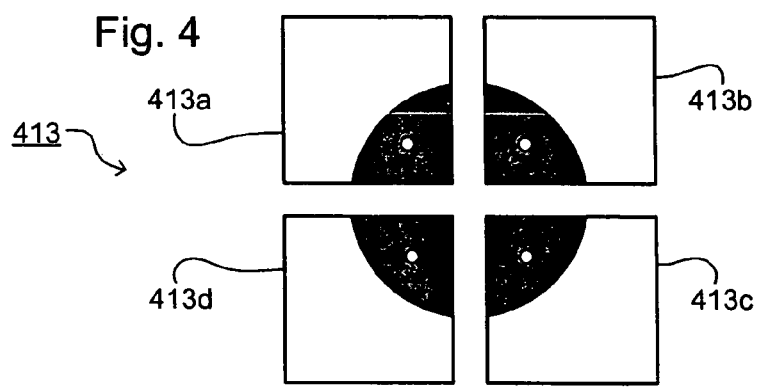
FIG. 4 is a diagram of a quad cell sensor used in the alignment system according to the first embodiment of the invention.

The main signal detection branch 41 of the detection module 4 comprises lenses 411, 412 which image the circular field of the alignment system on the center of a quad cell 413. The quad cell 413 has four sections 413a, b, c, d (shown in FIG. 4) so that four different points (shown by open circles) in the field can be measured. Each cell of the quad cell 413 is a silicon photodiode. The intensity detected by the cells of the quad cell is a sine function of substrate table position with which alignment can be carried out in a known manner. The exact position of the effective measurement point is dependent on the intensity distribution over the field and in general the layout of the photodiode and the shape of the field. Measuring at four points simultaneously provides advantages that the relative magnification and rotation of the reference grating with respect to the wafer grating can easily be determined from one alignment scan. This enables rapid initial alignment of the module and long-term monitoring of the performance of the alignment system.

A second, optional, signal detection branch 43 comprises a half-silvered mirror 431 to divert a proportion of the detection beam and a lens 432 which gathers the light and couples it into a multi-mode fiber 433 which transports it to a photo-multiplier tube 434 conveniently arranged in the electronics module of the apparatus. The photo-multiplier is used for detection of very weak alignment marks since it can do shot noise limited detection and noiseless amplification of the alignment signal.

Camera branch 42 comprises beams splitters 421, 422 and 425 as well as lens 423 which divert light onto CCD cameras 424, 426 placed respectively at image and pupil planes of the detection module and to split detector 427.

Figure 5:
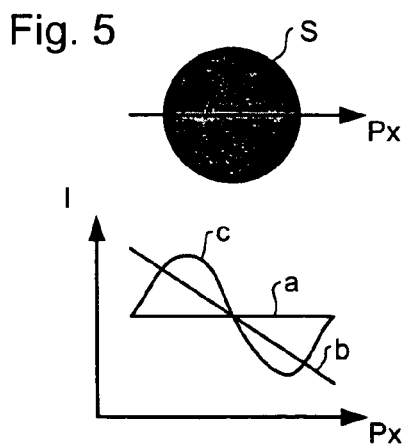
FIGS. 5 and 6 are diagrams used in explaining detection of correct focus in the alignment system.
Figure 6:
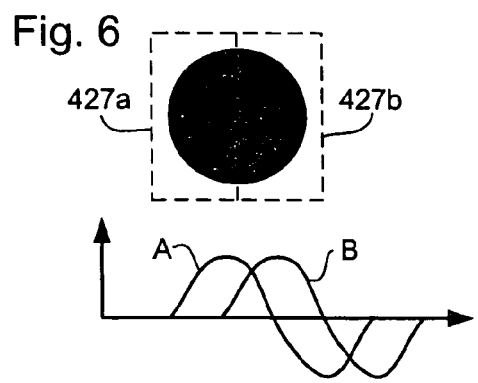

Split detector 427 is placed in a pupil plane of the reference grating 324. In this plane, there will be diffraction spots at a separation determined by the period of the substrate and reference gratings and a size determined by the aperture of the imaging system 3. If the imaging system 3 is in focus, i.e. the substrate and reference gratings are in conjugate planes, the intensity distribution in the spots will be homogeneous. However, defocus will cause inhomogeneities. This is shown in the graph of FIG. 5 which shows intensity with x position in the pupil plane. Horizontal straight line a is for a system in correct focus, inclined straight line b is for a system with slight defocus and sinusoidal curve c is for a system with a larger degree of defocus. If the gratings are scanned in the x-direction, the intensity profile will show a phase shift between the two halves of the photodetector, if the system is out of focus.

This arrangement can also be used with a detector divided into a greater number of segments. The above method of detecting defocus depends on height to the diffraction grating on the substrate and hence is not affected by subsequent process layers.

An alternative way to detect the focus signal makes use of the fact that the apparent aligned position is dependent on the angle of illumination of the alignment mark when it is not properly focussed. A split detector placed in the image pupil of the alignment system after the reference grating enables the apparent aligned position to be measured separately using beams that have a positive angle of incidence and beams that have a negative angle of incidence. The difference in apparent aligned position therefore indicates the degree of defocus.

It should be noted that the alignment signal is taken from the first orders coming from the reference grating and accordingly these orders are isolated from the remainder of the light by a pupil filter (not shown) provided in the pupil plane of the detection module.

The above alignment system is designed to receive light via a multi-mode fiber 22 and can use light in a broad wavelength range so that many different forms of light source 21 can be used. The source should have a range of wavelengths, a set of discrete, spaced apart wavelengths or a variable wavelength, e.g. in the range of from 500 to 700 nm, and at the output of the fiber 22 should have a homogeneous spatial as well as angular distribution. Additionally, the light is preferably modulated, e.g. at 50 kHz, in a known manner to enable synchronous detection.

Possible sources are listed in the table below.

| Source | Wavelength (nm) |
| --- | --- |
| Xe-Arc Lamp | 500-700 |
| LED | 680 |
| He-Ne Laser | 632.8 |
| D-Nd-Yag Laser | 532 |
| Laser Diode | 640 |

Figure 7:
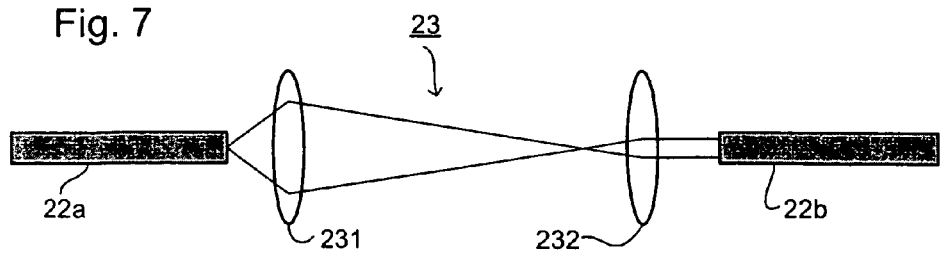
FIG. 7 is a diagram of a homogenizer used in the alignment system according to the first embodiment of the invention.

To provide the desired angular homogeneity, homogenizer 23 is provided in multi-mode fiber 22 which brings the illumination light from source 21. The multi-mode fiber 22 provides sufficient spatial homogeneity but retains any angular inhomogeneity of the source even for a 5 m long fiber. Homogenizer 23, as shown in FIG. 7, comprises lenses 231, 232 arranged such that fiber entrance of the output fiber 22b is located in the pupil of the optical system formed by lenses 231, 232. This effectively swaps the spatial and angular coordinates so that both the angular and spatial coordinates are homogenized by the two sections 22a, 22b of the multi-mode fiber 22 without introducing significant losses.

Figure 8:
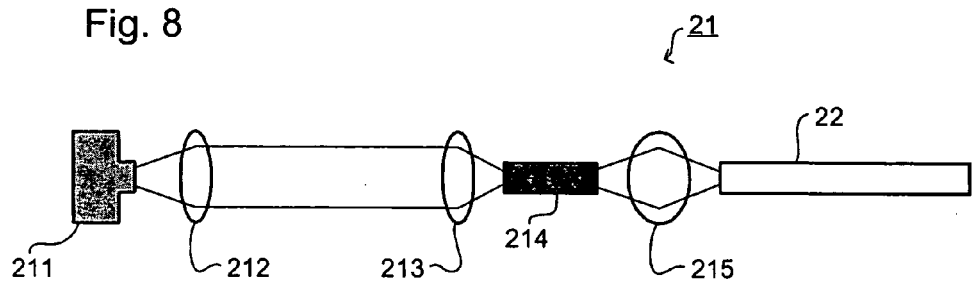
FIGS. 8 and 9 are diagrams of two alternative light sources usable in the first embodiment of the invention.

A particularly preferred radiation source 21 is shown in FIG. 8. Radiation source 21 comprises a laser or laser diode 211 emitting light having a wavelength in the blue region of the spectrum. The blue light is focussed by lenses 212, 213 on a fluorescent crystal 214. This may comprise Yag:Ce or ND:Yag crystals or the like. These crystals, when excited by blue wavelength radiation, emit fluorescent light with a broad band of wavelengths. If the crystals are not in a laser cavity, the emission is isotropic over the total space of the channel filled with the crystal which can be made small such that some radiation is locked into the channel which acts as a multi-mode wave guide. Radiation then leaves the channel on one side forming a source with a high intensity and a low etendue. The radiation is coupled into fiber 22 by lens 215. The size of the channel is dependent on the size of the crystals and may, for example, have a 100 µm cross-section. The walls of the channels may be transmissive or reflective, a reflective wall giving a higher efficiency. The color of the output can be adjusted by mixing different types of crystal.

Figure 9:
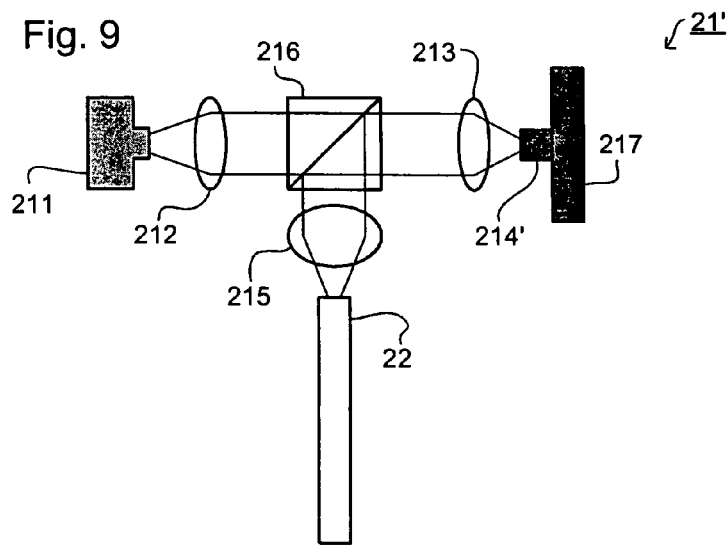

FIG. 9 shows a variant light source 21' in which the fluorescent crystals 214' are mounted on a reflective substrate 217. A beam splitter 216 is provided to direct the output, via collimating lens 215, into multi-mode fiber 22.

While specific embodiments of the invention have been described above, it will be appreciated that the invention may be practiced otherwise than as described. The description is not intended to limit the invention. Although the invention has been described in relation to alignment of a substrate to a reference grating, it may also be used for alignment of other objects, e.g. a mask.

The invention claimed is:

1. An alignment system for aligning a substrate in a lithographic apparatus comprising:
   an illumination system configured to illuminate a phase grating on the substrate;
   an imaging system configured to image diffracted light from said phase grating onto a reference grating substantially correctly at at least two distinct wavelengths; and
   a field stop located at an intermediate plane and configured to adjust a field of illumination on said phase grating and said reference grating,
   wherein said imaging system includes an optical system configured to image said phase grating onto the intermediate plane.

2. An alignment system according to claim 1, wherein the illumination system is configured to illuminate the phase grating with a numerical aperture greater than about 0.01.

3. An alignment system according to claim 1, wherein the imaging system has a numerical aperture greater than about 0.7.

4. An alignment system according to claim 1, further comprising a radiation system configured to supply the illumination system with a radiation.

5. An alignment system according to claim 1, wherein said radiation system includes a broadband source with a low etendue configured to emit broadband radiation in the visible spectrum.

6. An alignment system according to claim 1, wherein said imaging system includes optical components mounted on a reference frame of said lithographic apparatus.

7. An alignment system according to claim 1, wherein said phase grating is a two dimensional phase grating having diamond shaped unit cells.

8. An alignment system according to claim 1, further comprising a detection system configured to measure an intensity of the light from said phase grating.

9. An alignment system according to claim 8, wherein said detection system includes a cell detector comprising a plurality of cells, each of said plurality of cells being configured to simultaneously detect a portion of the light from said phase grating.

10. An alignment system according to claim 9, wherein each of said plurality of cells includes a silicon photodiode.

11. An alignment system according to claim 9, wherein the intensity detected by said plurality of cells is a sine function of substrate table position.

12. An alignment system according to claim 9, wherein said plurality is four.

13. An alignment system according to claim 8, wherein said detection system includes a camera branch configured to provide images of a pupil plane of said imaging system and images of said phase grating.

14. An alignment system according to claim 13, wherein said camera branch includes a CCD camera.

15. An alignment system according to claim 1, wherein said phase grating is illuminated with a modulated light.

16. An alignment system for aligning a substrate in a lithographic apparatus comprising:
   an illumination system configured to illuminate a phase grating on the substrate;
   an imaging system configured to image diffracted light from said phase grating onto a reference grating substantially correctly at at least two distinct wavelengths;
   a field stop configured to adjust a field of illumination on said phase grating and said reference grating; and
   a spatial filter, separate from said field stop, located at a pupil plane of said imaging system.

17. An alignment system according to claim 16, wherein said spatial filter includes apertures in a first and second direction, said spatial filter being configured to select orders diffracted in said first and second direction.

18. An alignment system according to claim 16, wherein said spatial filter is configured to block zero order diffracted light.

19. An alignment system, for aligning a substrate in a lithographic apparatus comprising:
   an illumination system configured to illuminate a phase grating on the substrate;
   an imaging system configured to image diffracted light from said phase grating onto a reference grating substantially correctly at at least two distinct wavelengths;
   a field stop configured to adjust a field of illumination on said phase grating and said reference grating; and
   a detection system configured to measure an intensity of the light from said phase grating, said detection system comprising a main signal detection branch and an alternative signal detection branch, said alternative signal detection branch being configured to measure a low intensity of said light from said phase grating.

20. An alignment system according to claim 19, wherein said alternative signal detection branch includes a photomultiplier.

21. An alignment system for aligning a substrate in a lithographic apparatus comprising:
   an illumination system configured to illuminate a phase grating on the substrate;
   an imaging system configured to image diffracted light from said phase grating onto a reference grating substantially correctly at at least two distinct wavelengths;
   a field stop configured to adjust a field of illumination on said phase grating and said reference grating; and
   a detection system configured to, in a same scan of the phase grating or the reference grating with respect to the other, measure an intensity of the light from said phase grating to detect an alignment signal and, to detect a focus signal of said lithographic apparatus.

22. A method of aligning a substrate in a lithographic apparatus comprising:
   illuminating a phase grating on a substrate;
   imaging light diffracted by said phase grating onto an intermediate plane;
   imaging light diffracted by said phase grating onto a reference grating substantially correctly at at least two distinct wavelengths;
   adjusting, at said intermediate plane, a field of illumination on said phase grating and said reference grating; and
   detecting light transmitted through said reference grating.

* * * * *